(12) United States Patent
Liu

(10) Patent No.: US 7,939,921 B2
(45) Date of Patent: May 10, 2011

(54) LEADFRAME

(75) Inventor: Sheng-Tsung Liu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 82 days.

(21) Appl. No.: 12/549,623

(22) Filed: Aug. 28, 2009

(65) Prior Publication Data

US 2010/0059871 A1  Mar. 11, 2010

(30) Foreign Application Priority Data

Sep. 10, 2008  (CN) .......................... 2008 1 0212841

(51) Int. Cl.
*H01L 23/48* (2006.01)
*H01L 23/495* (2006.01)
*H01L 29/78* (2006.01)
*H01L 29/739* (2006.01)

(52) U.S. Cl. ......... 257/676; 257/E23.031; 257/E23.051; 257/E23.044; 257/E23.092; 257/E23.125; 257/675; 257/674; 257/712

(58) Field of Classification Search .................. 257/676, 257/E23.031, 671, 672, 684, 675, 674, 666, 257/712, 713, 717, 720, E23.051, E23.044, 257/E23.092, E23.125, E21.499; 438/107
See application file for complete search history.

(56) References Cited

U.S. PATENT DOCUMENTS

| | | | | |
|---|---|---|---|---|
| 4,124,864 A | * | 11/1978 | Greenberg | 257/675 |
| 4,125,740 A | * | 11/1978 | Paletto | 174/530 |
| 4,346,396 A | * | 8/1982 | Carroll et al. | 257/674 |
| 5,338,971 A | * | 8/1994 | Casati et al. | 257/666 |
| 6,479,327 B2 | * | 11/2002 | Takahashi et al. | 438/124 |
| 7,429,757 B2 | * | 9/2008 | Oyama et al. | 257/98 |
| 2001/0050422 A1 | * | 12/2001 | Kishimoto et al. | 257/678 |
| 2003/0153134 A1 | * | 8/2003 | Kawata et al. | 438/123 |
| 2004/0150077 A1 | * | 8/2004 | Fujita | 257/666 |
| 2007/0172980 A1 | * | 7/2007 | Tanaka et al. | 438/106 |
| 2008/0164590 A1 | * | 7/2008 | Xiaochun et al. | 257/675 |
| 2009/0091010 A1 | * | 4/2009 | Calo et al. | 257/675 |
| 2010/0020839 A1 | * | 1/2010 | Fujino et al. | 372/50.1 |

FOREIGN PATENT DOCUMENTS

JP  2009-105266 A  *  5/2009

* cited by examiner

*Primary Examiner* — Alexander O Williams
(74) *Attorney, Agent, or Firm* — J.C. Patents

(57) ABSTRACT

A leadframe including a chip supporting plate, a lead forming plate, and solder points is provided. A notch is formed on an edge of the chip supporting plate. The thickness of the lead forming plate is less than the thickness of the chip supporting plate. The lead forming plate has a main body, inner leads, and a connecting rod. The inner leads and the connecting rod are extended from an edge of the main body. The connecting rod has an end portion fitting the notch. The solder points are located at the boundary between the end portion and the notch for structurally connecting the connecting rod and the chip supporting plate.

20 Claims, 3 Drawing Sheets

LEADFRAME

CROSS-REFERENCE TO RELATED APPLICATION

This application claims the priority benefit of P.R.C. patent application serial no. 200810212841.3, filed on Sep. 10, 2008. The entirety of the above-mentioned patent application is hereby incorporated by reference herein and made a part of specification.

BACKGROUND OF THE INVENTION

1. Field of the Invention

The present invention relates to a leadframe, and more particularly to a leadframe with different thicknesses.

2. Description of Related Art

A wire bonding technology is a common chip packaging technology applied to electrically connect a chip to a carrier. To satisfy requirements for low pin counts, a leadframe is frequently used as a chip carrier in the wire bonding technology. In most cases, the leadframe includes a die base for accommodating the chip and a plurality of leads disposed around the die base. Since the leadframe is often made of processing metal thin plates, the thickness of the die base and the thickness of the leads in the leadframe are the same.

However, the conventional leadframe with a relatively small thickness can barely achieve the heat dissipation efficiency required by a high power chip (e.g. a power source chip for controlling a power supply). Therefore, a leadframe including a relatively thick chip supporting plate, a relatively thin lead forming plate, and a connecting rod for connecting the chip supporting plate and the lead forming plate is provided. Note that the lead forming plate (the lead) cannot be excessively thick in order to comply with demands on design.

According to the related art, the leadframe with said specification can be made by rolling a metal thin plate. Nonetheless, compared with a single-gauge leadframe, the aforesaid leadframe increases the costs and prolongs a lead-time of the leadframe, particularly a brand new leadframe.

SUMMARY OF THE INVENTION

The present invention is directed to a leadframe serving as a chip carrier used in a wire bonding technology.

The present invention provides a leadframe including a chip supporting plate, a lead forming plate, and a plurality of solder points. The chip supporting plate and the lead forming plate are two individual components. A notch is formed on an edge of the chip supporting plate. The thickness of the lead forming plate is less than the thickness of the chip supporting plate. The lead forming plate has a main body, a plurality of inner leads, and a connecting rod. The inner leads and the connecting rod are extended from an edge of the main body. The connecting rod has an end portion fitting the notch. The solder points are located at the boundary between the end portion and the notch for structurally connecting the connecting rod and the chip supporting plate.

In an embodiment of the present invention, the solder points are separately located at the boundary between the end portion and the notch.

In an embodiment of the present invention, the solder points are laser solder points.

In an embodiment of the present invention, the chip supporting plate has a first surface, and the end portion has a second surface. The first surface and the second surface are substantially coplanar, and the solder points are disposed at the boundary between the first surface and the second surface.

In an embodiment of the present invention, the main body and the chip supporting plate are respectively located on two planes that are parallel to but are not overlapped with each other.

In an embodiment of the present invention, the connecting rod is a bent structure for connecting the main body and the chip supporting plate.

In an embodiment of the present invention, the end portion and the notch have the same shape.

In an embodiment of the present invention, the dimension of the end portion is slightly smaller than the dimension of the notch.

In an embodiment of the present invention, a gap exists between the end portion and the notch.

In an embodiment of the present invention, the chip supporting plate and the lead forming plate are two individual components.

In an embodiment of the present invention, a material of the solder points is the same as a material of the connecting rod and a material of the chip supporting plate.

The present invention provides a leadframe including a chip supporting plate and a lead forming plate. The chip supporting plate and the lead forming plate are two individual components. A notch is formed on an edge of the chip supporting plate. The thickness of the lead forming plate is less than the thickness of the chip supporting plate. The lead forming plate has a main body, a plurality of inner leads, and a connecting rod. The inner leads and the connecting rod are extended from an edge of the main body. The connecting rod has an end portion fitting the notch. The end portion of the connecting rod is structurally connected to the notch of the chip supporting plate by laser welding.

In an embodiment of the present invention, the chip supporting plate has a first surface, and the end portion has a second surface. The first surface and the second surface are substantially coplanar.

In an embodiment of the present invention, the main body and the chip supporting plate are respectively located on two planes that are parallel to but are not overlapped with each other.

In an embodiment of the present invention, the connecting rod is a bent structure for connecting the main body and the chip supporting plate.

In an embodiment of the present invention, the end portion and the notch have the same shape.

In an embodiment of the present invention, the dimension of the end portion is slightly smaller than the dimension of the notch.

In an embodiment of the present invention, a gap exists between the end portion and the notch.

In an embodiment of the present invention, the chip supporting plate and the lead forming plate are two individual components.

In an embodiment of the present invention, solder points exist at the boundary between the end portion and the notch.

In light of the foregoing, the chip supporting plate and the lead forming plate of the present invention are two individual components respectively having a single gauge. As such, the leadframe in the present invention can be fabricated with low manufacturing costs in a relatively short period of time. In addition, the chip supporting plate and the lead forming plate of the present invention are connected to each other by means of a plurality of solder points. Hence, stresses generated between the connecting rod and the chip supporting plate can be released at disconnected portions between the connecting rod and the chip supporting plate. Thereby, a service life of the leadframe can be extended. On the other hand, the chip supporting plate and the connecting rod are connected by laser welding according to the present invention. Thereby, the connecting rod and the chip supporting plate are partially heated at a rapid welding speed. Moreover, the welding quality can be guaranteed, and thermal stresses are not prone to be accumulated.

In order to make the above and other objects, features and advantages of the present invention more comprehensible, an embodiment accompanied with figures is described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1:
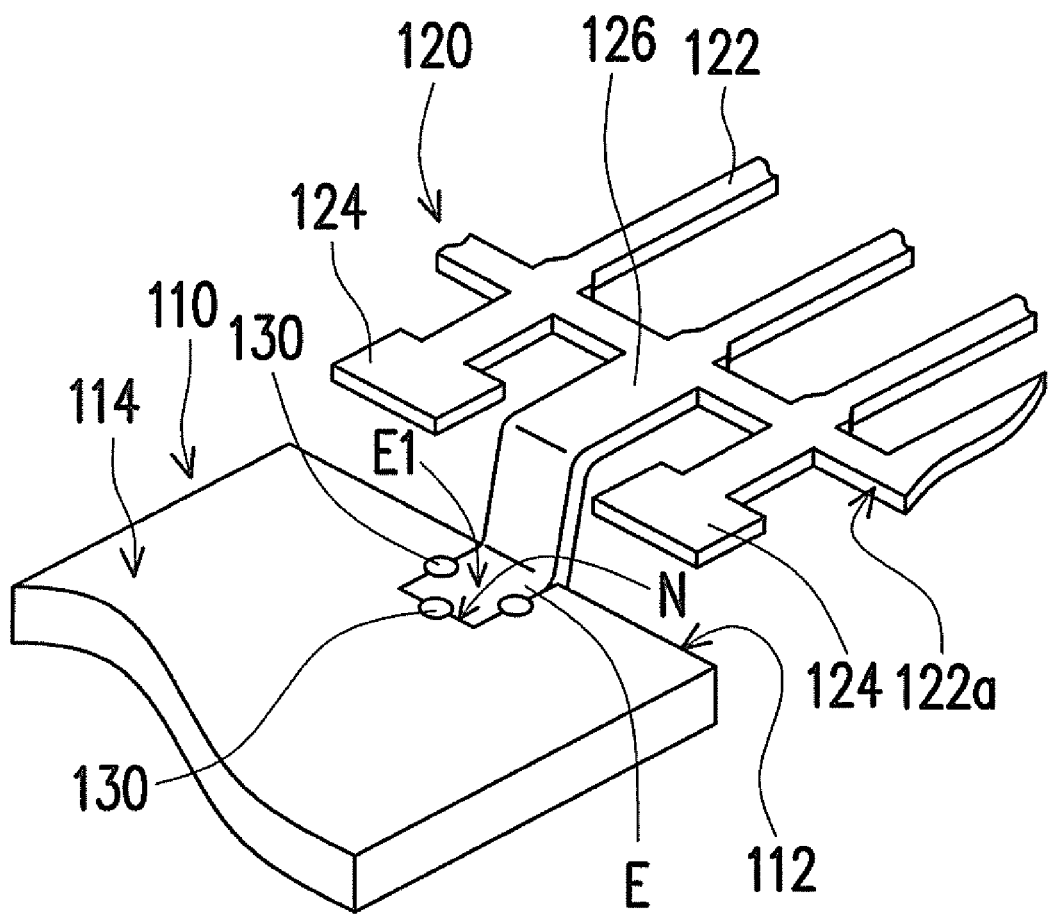
FIG. 1 is a schematic three-dimensional view of a leadframe according to an embodiment of the present invention.
Figure 2A:
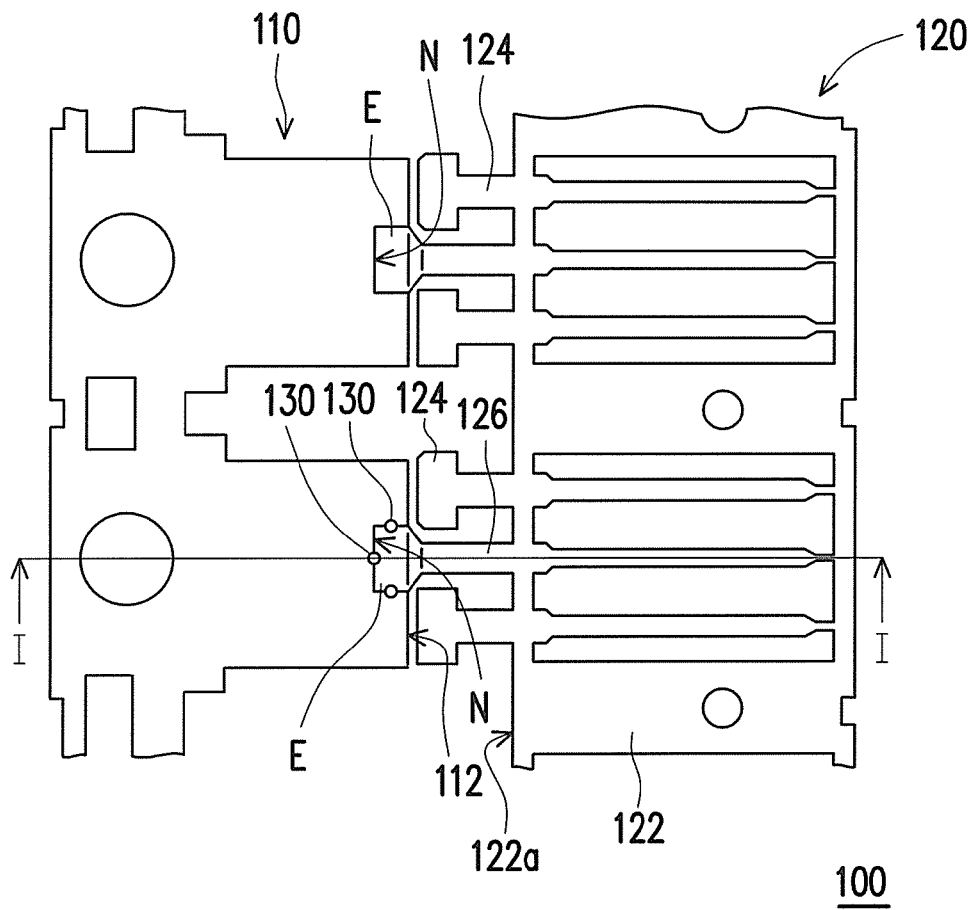
FIG. 2A is a top view of the leadframe depicted in FIG. 1.
Figure 2B:
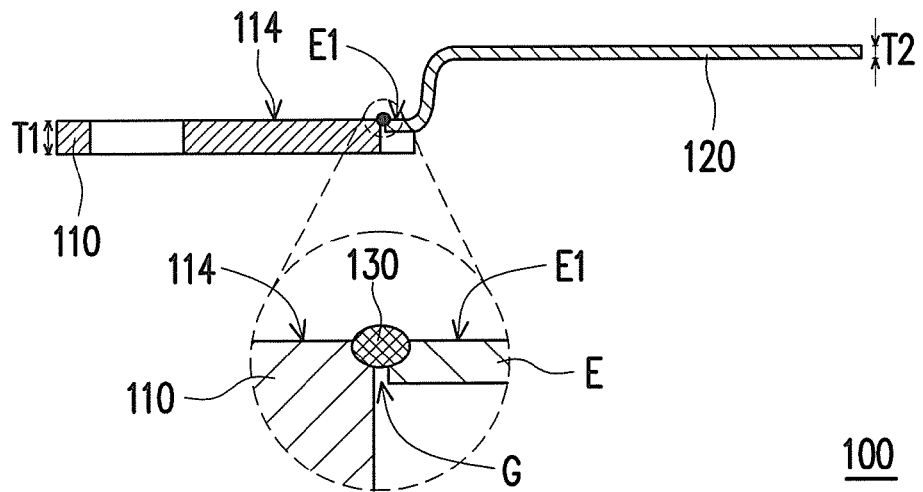
FIG. 2B is a schematic cross-sectional view taken along a line I-I in FIG. 2A.
Figure 3:
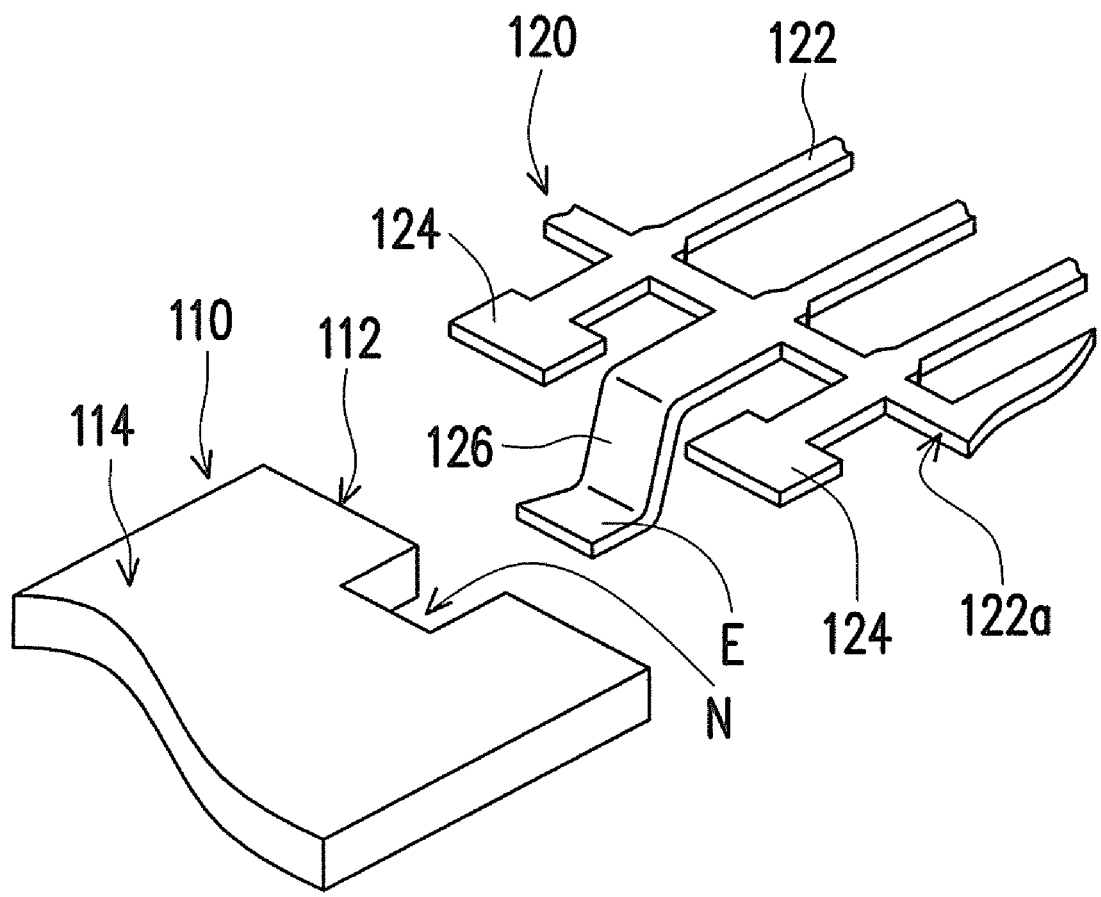
FIG. 3 is a schematic three-dimensional view of a chip supporting plate and a lead forming plate of the leadframe depicted in FIG. 1. Here, the chip supporting plate and the lead forming plate are not yet welded.

FIG. 1 is a schematic three-dimensional view of a leadframe according to an embodiment of the present invention. FIG. 2A is a top view of the leadframe depicted in FIG. 1. FIG. 2B is a schematic cross-sectional view taken along a line I-I in FIG. 2A. FIG. 3 is a schematic three-dimensional view of a chip supporting plate and a lead forming plate of the leadframe depicted in FIG. 1. Here, the chip supporting plate and the lead forming plate are not yet welded.

Referring to FIGS. 1, 2A, and 2B, a leadframe 100 of the present embodiment includes a chip supporting plate 110, a lead forming plate 120, and a plurality of solder points 130. A notch N is formed on an edge 112 of the chip supporting plate 110. The thickness T2 of the lead forming plate 120 is less than the thickness T1 of the chip supporting plate 110.

The lead forming plate 120 includes a main body 122, a plurality of inner leads 124, and a connecting rod 126. The inner leads 124 and the connecting rod 126 are extended from an edge 122a of the main body 122, and the connecting rod 126 has an end portion E fitting the notch N. Specifically, in the present embodiment, the end portion E and the notch N can have the same shape, while the dimension of the end portion E is slightly smaller than the dimension of the notch N. In addition, a gap G exists between the end portion E and the notch N (as shown in FIG. 2B).

Besides, referring to FIG. 3, the chip supporting plate 110 and the lead forming plate 120 are two individual components in the present embodiment. Therefore, a rolling process can be performed on two metal thin plates with different stresses, so as to form the two metal thin plates with different thicknesses. The two metal thin plates are then patterned to form the chip supporting plate 110 and the lead forming plate 120. Thereby, it is not necessary to additionally perform another conventional rolling process on the two metal thin plates. As a result, the manufacturing process of the leadframe 100 in the present embodiment is simplified, and manufacturing costs and manufacturing time of the leadframe 100 are reduced.

The end portion E of the connecting rod 126 is structurally connected to the notch N of the chip supporting plate 110 by laser welding, for example. Hence, the quality of laser welding can be easily ascertained by observing the surface of the leadframe 100. Moreover, only the end portion E and the notch N of the chip supporting plate 110 are heated at a rapid welding speed when the laser welding process is implemented. Therefore, satisfactory welding quality can be guaranteed, and thermal stresses are not prone to be accumulated. Besides, the laser welding process can be performed separately at the boundary between the end portion E and the notch N according to the present embodiment.

Referring to FIGS. 1, 2A, and 2B, the solder points 130 are located at the boundary between the end portion E and the notch N for structurally connecting the connecting rod 126 and the chip supporting plate 110. The connecting area between the connecting rod 126 and the chip supporting plate 110 is relatively small, and therefore the stress (e.g. the thermal stress) generated between the connecting rod 126 and the chip supporting plate 110 can be released at disconnected portions (the gap G as shown in FIG. 2B) between the connecting rod 126 and the chip supporting plate 110.

In the present embodiment, the solder points 130 can be separately located at the boundary between the end portion E and the notch N, and the solder points 130 are, for example, laser solder points. That is to say, the solder points 130 are, for example, point-shaped structures formed by melting a part of the end portion E and the notch N of the chip supporting plate 110 when the end portion E of the connecting rod 126 is connected to the notch N of the chip supporting plate 110 by laser welding. Hence, a material of the solder points 130 is, for example, the same as a material of the connecting rod 126 and a material of the chip supporting plate 110.

Additionally, in the present embodiment, the main body 122 and the chip supporting plate 110 are respectively located on two planes that are parallel to but are not overlapped with each other. The chip supporting plate 110 has a first surface 114, and the end portion E has a second surface E1. The first surface 114 and the second surface E1 are substantially coplanar. Thereby, in the present embodiment, a welding process can be performed at the boundary between the first surface 114 and the second surface E1 that are coplanar, so as to form the solder points 130. Besides, the welding quality of the solder points 130 can be inspected directly by observing the surface of the leadframe 100.

Moreover, in the present embodiment, the connecting rod 126 can have a bent structure for connecting the main body 122 and the chip supporting plate 110 respectively disposed on two planes that are parallel to but are not overlapped with each other. The second surface E1 of the end portion E and the first surface 114 of the chip supporting plate 110 can be substantially coplanar.

Based on the above, in the present invention, the chip supporting plate and the lead forming plate are two individual components respectively having a single gauge. As a result, the manufacturing process of the leadframe in the present invention is simplified, and the manufacturing costs and the manufacturing time of the leadframe are reduced. In addition, the chip supporting plate and the lead forming plate of the present invention are connected to each other by means of a plurality of solder points. Hence, the stress generated between the connecting rod and the chip supporting plate can be released at the disconnected portions between the connecting rod and the chip supporting plate. Thereby, a service life of the leadframe can be extended.

Furthermore, the chip supporting plate is connected to the end portion of the connecting rod by laser welding according to the present invention. Thereby, only the end portion and the notch of the chip supporting plate are heated at a rapid welding speed, such that the welding quality can be guaranteed, and the thermal stress is not prone to be accumulated. Aside from that, the laser welding quality can be easily ascertained by observing the surface of the leadframe.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A leadframe, comprising:
a chip supporting plate, a notch being formed on an edge of the chip supporting plate;
a lead forming plate, the thickness of the lead forming plate being less than the thickness of the chip supporting plate, the lead forming plate comprising a main body, a plurality of inner leads, and a connecting rod, wherein the inner leads and the connecting rod are extended from an edge of the main body, the connecting rod has an end portion fitting the notch, and the chip supporting plate and the lead forming plate are two individual components; and
a plurality of solder points, located at the boundary between the end portion and the notch for structurally connecting the connecting rod and the chip supporting plate.

2. The leadframe as claimed in claim 1, wherein the solder points are separately located at the boundary between the end portion and the notch.

3. The leadframe as claimed in claim 1, wherein the solder points are laser solder points.

4. The leadframe as claimed in claim 1, wherein the chip supporting plate has a first surface, the end portion has a second surface, the first surface and the second surface are substantially coplanar, and the solder points are disposed at the boundary between the first surface and the second surface.

5. The leadframe as claimed in claim 1, wherein the main body and the chip supporting plate are respectively located on two planes that are parallel to but are not overlapped with each other.

6. The leadframe as claimed in claim 5, wherein the connecting rod is a bent structure for connecting the main body and the chip supporting plate.

7. The leadframe as claimed in claim 1, wherein the end portion and the notch have the same shape.

8. The leadframe as claimed in claim 7, wherein the dimension of the end portion is slightly smaller than the dimension of the notch.

9. The leadframe as claimed in claim 8, wherein a gap exists between the end portion and the notch.

10. The leadframe as claimed in claim 1, wherein the chip supporting plate and the lead forming plate are two individual components.

11. The leadframe as claimed in claim 1, wherein a material of the solder points is the same as a material of the connecting rod and a material of the chip supporting plate.

12. A leadframe, comprising:
a chip supporting plate, a notch being formed on an edge of the chip supporting plate; and
a lead forming plate, the lead forming plate and the chip supporting plate being two individual components, the thickness of the lead forming plate being less than the thickness of the chip supporting plate, the lead forming plate comprising a main body, a plurality of inner leads, and a connecting rod, wherein the inner leads and the connecting rod are extended from an edge of the main body, the connecting rod has an end portion fitting the notch, and the end portion is structurally connected to the notch of the chip supporting plate by laser welding.

13. The leadframe as claimed in claim 12, wherein the chip supporting plate has a first surface, the end portion has a second surface, and the first surface and the second surface are substantially coplanar.

14. The leadframe as claimed in claim 12, wherein the main body and the chip supporting plate are respectively located on two planes that are parallel to but are not overlapped with each other.

15. The leadframe as claimed in claim 14, wherein the connecting rod is a bent structure for connecting the main body and the chip supporting plate.

16. The leadframe as claimed in claim 12, wherein the end portion and the notch have the same shape.

17. The leadframe as claimed in claim 16, wherein the dimension of the end portion is slightly smaller than the dimension of the notch.

18. The leadframe as claimed in claim 17, wherein a gap exists between the end portion and the notch.

19. The leadframe as claimed in claim 12, wherein the chip supporting plate and the lead forming plate are two individual components.

20. The leadframe as claimed in claim 12, wherein solder points exist at the boundary between the end portion and the notch.

* * * * *